United States Patent [19]

Akahoshi et al.

[11] Patent Number: 4,642,161

[45] Date of Patent: Feb. 10, 1987

[54] METHOD OF BONDING COPPER AND RESIN

[75] Inventors: Haruo Akahoshi, Hitachi; Kanji Murakami, Mito; Motoyo Wajima, Hitachi; Kiyonori Kogawa; Ritsuji Toba, both of Hadano; Takeshi Shimazaki, Hitachi, all of Japan

[73] Assignee: Hitachi, Ltd., Tokyo, Japan

[21] Appl. No.: 823,003

[22] Filed: Jan. 27, 1986

[30] Foreign Application Priority Data

Jan. 31, 1985 [JP] Japan ................................ 60-16881

[51] Int. Cl.$^4$ ............................ C23F 1/02; B44C 1/22; B31B 31/26
[52] U.S. Cl. ................................ 156/630; 156/634; 156/656; 156/666; 156/902; 156/307.7; 156/314; 427/96
[58] Field of Search .................................... 427/96–98, 427/399; 156/630, 634, 656, 659.1, 666, 902, 307.7, 314, 317

[56] References Cited

U.S. PATENT DOCUMENTS

| 2,291,592 | 7/1942 | Dowling | 156/666 X |
| 3,728,178 | 4/1973 | Caule | 156/630 |
| 4,247,589 | 1/1981 | Greenspan | 428/209 |
| 4,316,942 | 2/1982 | Kuo | 428/432 |
| 4,358,479 | 11/1982 | Canestaro et al. | 156/630 X |
| 4,387,137 | 1/1983 | Rice | 428/332 |
| 4,409,037 | 10/1983 | Landau | 148/6.14 R |

FOREIGN PATENT DOCUMENTS

| 22372 | 9/1967 | Australia. |
| 0066330 | 12/1982 | European Pat. Off.. |
| 0089387 | 9/1983 | European Pat. Off.. |
| 613152 | 8/1976 | Switzerland. |

Primary Examiner—William A. Powell
Attorney, Agent, or Firm—Antonelli, Terry & Wands

[57] ABSTRACT

A method of bonding copper and a resin together is disclosed which comprises forming a copper oxide layer on the surface of copper to be bonded to a resin, reducing the copper oxide layer to metallic copper with a reducing solution, and bonding the metallic copper and the resin together. According to this method, a good acid resistance of the bonding interface and a sufficiently high bonding strength can be obtained.

11 Claims, 1 Drawing Figure

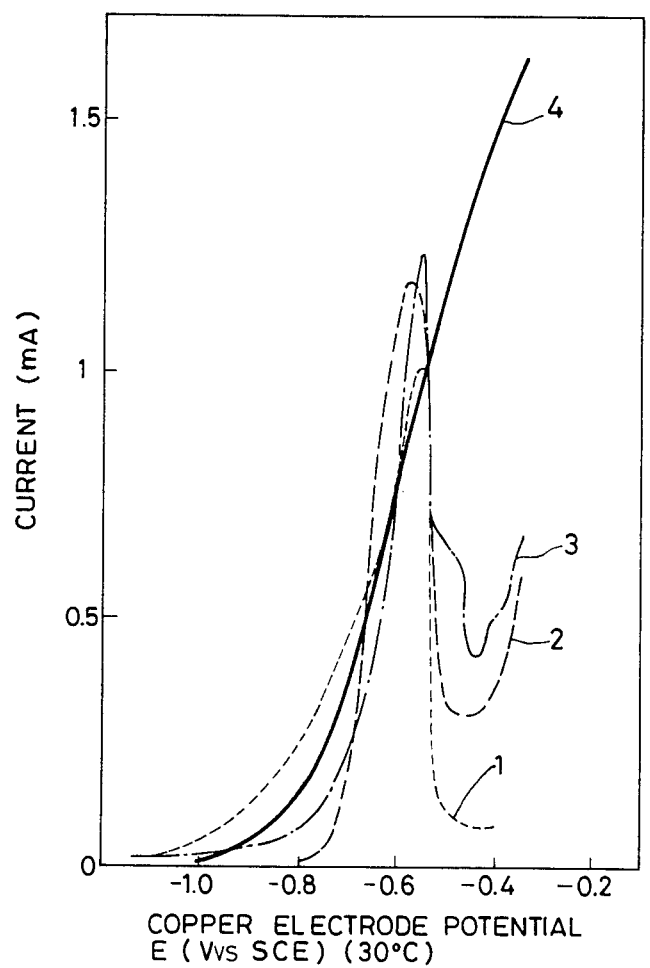

METHOD OF BONDING COPPER AND RESIN

BACKGROUND OF THE INVENTION

The present invention relates to a method of bonding copper and a resin together with consistently high bonding strength and acid resistance, and particularly to a method of mutually bonding copper and a resin, which is suitable for production of multilayer printed wiring boards by lamination of a copper wiring layer and a resin layer.

Since no sufficient bonding strength between a metal and a resin can be secured by directly bonding the resin onto an even surface of the metal, a known method has heretofore been employed in which an oxide layer is formed on the surface of a metal to improve the bonding strength, as described in "Plating and Surface Finishing" vol. 69, No. 6, pp. 96–99 (June, 1982). However, the method has involved a problem that many metallic oxides are, in general, readily hydrolyzed upon contact with an aqueous acidic solution to be dissolved therein as metallic ions.

A variety of methods have heretofore been investigated on the surface treatment of copper for bonding of copper and a resin. However, a sufficient bonding strength is hardly secured by bonding a resin onto the surface of copper as it is. Accordingly, investigations have been made on a copper surface treatment method in which an oxide layer consisting of cuprous oxide, cupric oxide, or the like is formed on the surface of copper according to any one of various procedures to improve the bonding strength. For instance, a method of forming an oxide layer has been known in which a copper surface to be subjected to a bonding operation is treated with an aqueous alkaline solution containing potassium persulfate or sodium chlorite. Such a method of forming a copper oxide layer is very effective in improving the bonding strength. However, a copper oxide is generally readily hydrolyzed and dissolved upon contact with an acid. Therefore, contact of the oxide with the acid after the treatment must be avoided till a bonding operation. Furthermore, it has been pointed out as regards the method that, when an acid treatment is conducted after the bonding operation, there arises a phenomenon unfavorable to bonding that the oxide layer in the inner wall portions thereof around holes running through the bonding interface and in the proximity of an exposed bonding interface in a cut end portion is dissolved and soaked with the acid to result in loss of the oxide layer in the bonding interface. This phenomenon has presented a serious problem particularly in mutual bonding of a copper wiring layer and a prepreg resin in a lamination process, in production of multilayer printed wiring boards, comprising a step of perforation to form through-holes running through the bonding interface after the bonding operation and a step of various acid treatments to effect through-hole plating.

Japanese Patent Laid-Open No. 153797/1981 includes a statement that the problematic acid resistance was improved by a method comprising forming cupric oxide on the surface of copper and reducing the cupric oxide to cuprous oxide. Generally speaking, cuprous oxide is elss soluble in an acid than cupric oxide. However, even cuprous oxide is not insoluble in an acid. Thus the improvement of the acid resistance is quite insufficient.

SUMMARY OF THE INVENTION

An object of the present invention is to provide a method of bonding copper and a resin together which provides a good acid resistance and a sufficiently high bonding strength, and particularly to provide a method of bonding copper and a resin together which is suitable for lamination in production of multilayer printed wiring boards requiring a high reliability.

In order to attain the above-mentioned object, the method of bonding copper and a resin together according to the present invention comprises the step of forming a copper oxide layer on the surface of copper by oxidation of copper, the step of reducing the formed copper oxide layer to metallic copper with a reducing solution, and the step of bonding the surface of the above-mentioned metallic copper formed by the reduction and a resin together by, for example, heat-pressing thereof. A solution containing at least one reducing agent represented by the general formula: $BH_3.NH RR'$ (wherein R and R' are each a member selected from the group consisting of H, $CH_3$, and $CH_2 CH_3$) provides good results as the above-mentioned reducing solution.

BRIEF DESCRIPTION OF THE DRAWING

FIG. 1 is a polarization diagram showing copper electrode potentials of various reducing agents.

DETAILED DESCRIPTION OF THE INVENTION

In general, the improved bonding strength due to formation of the oxide layer is believed to ensure from a higher chemical affinity of a copper oxide for a resin than that of metallic copper therefor. On the other hand, a copper clad laminate used in, for example, a printed wiring board has a rough surface having large unevennesses on the side of bonding (so-called mat side). The interlocking effect of the rough surface provides a sufficient bonding strength. By contrast, in the case of an even copper surface such as a polished copper surface, a common plated surface, or an etched surface, a difficulty in securing a sufficient bonding strength in encountered by only bonding a resin onto the copper surface as it is.

The oxide layer formed by the above-mentioned treatment has a surface having minute unevennesses. If the mechanical interlocking effect of such minute unevennesses were the main cause of the improved bonding strength, there should be a possibility of securing a sufficient bonding strength even without formation of the oxide layer. For example, if such minute unevennesses for securing a sufficient bonding strength could be materialized in the surface of metallic copper insoluble in an acid, the aforementioned problem of acid resistance could be obviated. As a result of extensive investigations from such a standpoint, the inventors of the present invention have found that a good acid resistance and an equivalent bonding strength to that in the case of mutual bonding of copper and a resin with an oxide layer therebetween can be materialized by first forming an oxide layer on the surface of copper and reducing the oxide layer to effect metalization. This will support the above-mentioned inference to the effect that the main cause of the improvement in the bonding strength by formation of the oxide layer might be the mechanical interlocking effect of minute unevennesses formed in the surface in the course of formation of the oxide layer. In this case, application of an aqueous, neutral or alkaline solution containing an oxidizing agent is desired as the method of forming a copper oxide layer in the first step. For instance, the method of treatment with an aqueous alkaline solution containing an oxidizing agent such as sodium chlorite or potassium persulfate provides good results of bonding strength. The formed oxide layer may consist of either cuprous oxide or cupric oxide.

The thickness of the formed copper oxide layer is desired to be 100 to 50,000 Å for securing a good bonding strength. Where the thickness is 500 to 1,500 Å, particularly good results can be expected. The thickness of the copper oxide layer can be calculated from the Faraday constant and the molecular weight and specific weight of the copper oxide as well as the amount of electricity consumed for reduction per unit area when the copper oxide layer is electrochemically reduced in an aqueous electrolyte solution (for example, an aqueous KCl solution having a concentration of 1 mol/l). The conditions for formation of a copper oxide layer having a desired thickness are determined in a preliminary experiment. Formation of a copper oxide layer has only to be done in accordance with the predetermined conditions. When the thickness of the copper oxide layer is outside the above-mentioned range, no good bonding strength can be expected.

Two specific examples of the method of forming a copper oxide layer will now be described.

(i) Copper is immersed in an aqueous solution of 40° to 95° C. (more preferably 60° to 95° C.) containing 2 to 200 g/l of a chlorite such as sodium chlorite or a persulfate such as potassium persulfate and 0.1 to 50 g/l of NaOH for making the solution alkaline with a pH of 8 or more for 10 seconds to 10 minutes (more preferably 60 to 180 seconds.

(ii) Copper is immersed in an aqueous solution of 50° to 90° C. containing 2 to 50 g/l of copper acetate, 3 to 120 g/l of ammonium acetate, 0.5 to 10 g/l of copper sulfate, 0.5 to 20 g/l of ammonium chloride, and 1 to 20 cc/l of aqueous ammonia having a concentration of 28 wt. % for 10 seconds to 10 minutes.

On the other hand, a conceivable method of reducing the oxide layer formed comprises supply of electricity into an electrolyle solution from the outside to effect electrochemical reduction. However, electrical connection of all the portions to be subjected to the reduction treatment is necessary for adopting the electrochemical reduction method, which cannot be employed where there are any electrically isolated portions. For instance, in a printed wiring board, insular portions not electrically connected to the peripheral portion are present in many cases after formation of a wiring conductor pattern. Thus a difficulty is experienced in applying the electro-chemical reduction method to the whole surface. In these cases, reduction of the oxide layer to metallic copper by a chemical treatment with a chemical is desired. Reducing agents that is generally used in the form of an aqueous solution include formaldehyde, hypophosphites, and hydrazine. Formaldehyde is an effective reducing agent for electroless copper plating. However, the results of examination made by the inventors of the present invention showed that the oxide layer as mentioned above is hardly reduced to metallic copper with these reducing agents under usual conditions. The surface of a copper foil assumed a dark brown when an oxide layer was formed thereon, and still had the dark brown color even after treated with, for example, formalin. However, when the copper foil was immersed in 1:1 hydrochloric acid (an equi-volume mixture of 36 wt. % hydrochloric acid and water; the same will apply hereinafter), the dark brown readily disappeared and turned to a light copper red peculiar to metallic copper. This is because the oxide layer was dissolved upon contact with the acid without metalization. Hypophosphites and hydrazine also provided the same results. These reducing agents did not attain metalization of the oxide layer even when the concentration, the pH value, or the treatment temperature was changed.

As far as the range of examination made by the inventors of the present invention is concerned, reducing agents capable of reducing the oxide layer formed on the surface of copper to metallic copper are extremely limitative. Such reducing agents are only limited amine boranes represented by a general formula: $BH_3 \cdot NHRR'$ (wherein R and R' are each a member selected from the group consisting of H, $CH_3$, and $CH_2CH_3$), and including dimethylamine borane and ammonia borane. Accordingly, an aqueous solution of an amine borane is suitable as the reducing solution used in the method of bonding copper and a resin together according to the present invention. In this case, the amine boran concentration is preferably 0.1 g/l or higher, more preferably 1 to 10 g/l. The pH value of the aqueous solution is preferably 7 or higher, more preferably 12 to 13, but the aqueous solution may be weakly acidic. The temperature of the aqueous solution may be room temperature to 70° C., more preferably 40° to 50° C. When copper having a copper oxide layer is immersed in a reducing solution as mentioned above, bubbles vigorously generate from the surface of the oxide while the oxide reacts with the solution. It is necessary to continue the immersion till the reduction reaction is completed, specifically till the generation of bubbles stops. When the concentration, pH value, and/or temperature of the abovementioned aqueous solution is lower than the abovementioned value, the period of time required for reduction of the oxide is lengthened. Too high a temperature of the solution causes self-decomposition of an amine borane. Thus the upper limit of the temperature may be about 70° C.

The surfaces of a copper sample are usually washed with water after formation of an oxide layer and after reduction of the same. A water washing time of several seconds to several minutes is sufficient. Running water is conveniently used for repetition of water washing.

When a copper surface having an oxide layer preliminarily formed thereon was treated with an aqueous solution containing at least one kind of amine boranes as mentioned above, even direct immersion of the copper in 1:1 hydrochloric acid did not cause discoloration nor dissolution. This is because the oxide layer is reduced to acid-insoluble metallic copper by the reduction treatment with a solution containing dimethylamine borane. As a result of X-ray diffraction analysis of the copper foil subjected to the treatment for formation of the above-mentioned copper oxide layer, a diffraction line peculion to CuO was observed to confirm formation of a film of cupric oxide on the copper surface. On the other hand, no diffraction line peculiar to CuO was detected from the surface of the copper foil after the reduction treatment with the solution of dimethylamine borane.

Also, no diffraction line corresponding to $Cu_2O$ was observed to confirm complete reduction of the oxide layer to metallic copper. The copper surface after the reduction treatment did not have a light copper red peculiar to an even surface of metallic copper and had a dark brown rather close to the color tone of the oxide film as described above. This suggests that the color tone of dark brown developed by formation of the oxide layer may derive from the form of the surface having minute unevennesses, and that the above-mentioned form may be kept in the surface layer metalized after the reduction treatment.

The main presumptive reason why only the specific amine boranes are effective for reduction of the formed oxide layer may be different reaction activities of various reducing agents on the copper oxide. As is well known, formaldehyde is widely used as the reducing agent for electroless copper plating. The reaction of oxidation in the copper surface with formaldehyde involves a sufficient standard electrode potential capable of reducing a copper oxide to metallic copper in a thermodynamic sense. As already described, however, it is impossible to reduce the copper oxide to metallic copper with formaldehyde. The reaction of oxidation in the copper surface with formaldehyde is largely dependent on the catalyzing power of the surface of metallic copper. It is believed that reduction of the copper oxide in the surface thereof is impossible because the surface of the copper oxide might not have good catalysis as in the case of the surface of metallic copper. The same will hold also in the case of sodium borohydride, hydrazine, etc. By contrast, in the case of the above-mentioned specific amine boranes, their oxidation reaction might not be so much dependent on the catalysis of the surface, leading to smooth occurrence of the reaction even in the surface of a copper oxide to reduce the same to metallic copper. Such a difference in catalytic activity of the surface can be clarified according to an electrochemical procedure. The determination of anodic polarization curves of formaldehyde, sodium borohydride, hydrazine, etc. on a copper electrode revealed that, in a region where the electrode surface consists of metallic copper, increasing values of electrolytic current are observed with increasingly noble electrode potentials, while the value of electrolytic current drastically decreases just when it comes into a region where the surface of the copper electrode is covered with a further nobler copper oxide layer formed by oxidation thereof. This suggests low activities of these reducing agents on the copper oxide. By contrast, according to the results of examination made by the inventors of the present invention, it has been found that, in the case of the above-mentioned specific amine boranes, the value of electrolytic current does not decrease even in the electrode potential region where the copper oxide is formed on the copper surface, and increases with increasingly noble electrode potential. This makes it clear that the above-mentioned specific amine boranes have sufficiently high reducing powers even on the copper oxide.

For reference, FIG. 1 shows a diagram of characteristic polarization curves of various reducing agents on a copper electrode. The curves 1, 2, 3, and 4 concern reducing solutions containing 0.5M of NaOH and 0.1M of HCHO, $N_2H_4$, $NaBH_4$, and $BH_3.NH(CH_3)_2$ respectively. In the curves 1, 2, and 3, the electrolytic current flows more with increasing electrode potentials in a range of from $-1.0$ to $-0.6$ V, but a drastic current drop occurs just when the potential exceeds $-0.6$ V. By contrast, in the curve 4, the electrolytic current increases even when the potential exceeds $-0.6$ V. This is believed to be because addition of a reducing agent might convert a copper oxide on the surface of the electrode into metallic copper around $-0.5$ V in the case of the curve 4.

It has been further confirmed that, when the reduction treatment of the oxide layer is conducted using a solution of any one of the above-mentioned specific amine boranes, the bonding strength between copper and a resin after the reduction treatment is kept at a level as attained by providing the oxide layer on the copper surface to simultaneously materialize a good bonding strength and a good acid resistance.

When any one of these specific amine boranes is used, the copper oxide layer can be reduced to metallic copper to attain insolubilization of the copper surface in acids whichever of cuprous oxide and cupric oxide it may consist of.

In contrast, among amine boranes, a compound having alkyl groups substituting for all the hydrogen atoms in the amine moiety of the amine borane, such as trimethylamine borane or triethylamine borane, has a low solubility in water to make it difficult to use the same in the form of an aqueous solution and no sufficient reducing power. Thus no good results were obtained by using such a compound. In the above-mentioned amine boranes that can be used in the present invention, the larger the number of hydrogen atoms directly bonded to the nitrogen atom, the stronger the reducing power.

No good results were obtained, either, when a borohydride such as sodium borohydride, also known as a reducing agent based on a boron compound, was used. As the time of immersion in a solution of sodium borohydride was longer, the dark brown surface layer formed by the oxide layer formation treatment increasingly faded in a mottled form. This is believed to be because the surface might be gradually deformed during immersion to lose minute unevennesses. Such a phenomenon is undesirable for securing a uniform bonding strength. Moreover, since a borohydride is gradually reacted with water to be decomposed in an aqueous solution thereof, stable long-term use of the borohydride is difficult. It is necessary to keep the solution highly alkaline for maintaining the solution stable, thus presenting a problem of handling. Since the decomposition reaction is promoted when the temperature rises, it is difficult to enhance the reducing power by elevating the temperature of the solution.

The characteristic feature of this invention consists in preliminary formation of a copper oxide layer on the surface of copper and application of a reducing agent thereto to reduce the copper oxide to metallic copper in the method of bonding copper and a resin together by heat-pressing to simultaneously materialize good bonding strength and acid resistance. A group of specific amine boranes represented by the general formula: $BH_3.NHRR'$ (wherein R and R' are each H, $CH_3$, or $CH_2CH_3$) for use as the reducing agent in the reduction can provide good results. Application of an aqueous neutral or alkaline solution containing an oxidizing agent is desirable for formation of a copper oxide layer.

The reducing solution to be used in the present invention may be weakly acidic, neutral, or alkaline. Too low a pH value is not preferred since dissolution of the oxide layer occurs in competition with the reduction reaction. The rate of the reduction reaction depends on the reducing agent concentration, the solution temperature, and the pH value. By raising them, the reducing power can be enhanced and the reduction time can be shortened. Here, it is preferable to choose a temperature within a range where decomposition of an amine borane does not occur. For instance, in the case of dimethylamine borane, a temperature of 70° C. or less is desirable and sufficient for carrying out reduction. The pH value can be adjusted by addition of sodium hydroxide, sodium carbonate, sodium phosphate, or the like. As already described, smooth reduction of a copper oxide is possible even without addition of an alkali, though such addition can shorten the treatment time.

The copper that can be used in the method of this invention include electroplating copper, electroless copper, and rolled copper, and not restricted by the method of preparing the same. A small amount of a different metal may be added to copper to improve the properties thereof. Surface polishing or etching prior to formation of the oxide layer does not present any problems in practicing the process of this invention, and is rather preferred from the viewpoint of surface cleaning. It is further expected that the present invention may be applied also to copper alloys, besides copper, and other metals such as nickel, cobalt, nickel alloys, and cobalt alloys according to the procedure of forming an oxide layer and reducing the same.

The resins that can be used in the process of this invention include epoxy resins, polyamide resins, polyimide resins, polyester resins, and phenolic resins. Thermoplastic resins such as polyethylene, polyphenylene sulfide, polyether-imide resins, and fluororesins may also be used. When the method of this invention is applied to a multi-layer printed wiring board, a board of the above-mentioned resin containing a reinforcing material such as glass cloth is used and foil of electroplating copper, electroless copper, rolled copper, or the like is provided on both or one of its surfaces to form a desired pattern thereon as is well known. It is also possible to form a multilayer wiring board by laminating copper foils via a known prepreg prepared by impregnating a reinforcing material, such as glass cloth, with the above-mentioned resin, followed by pressing and heating to effect bonding between the resin of the prepreg and the copper foil. According to such a procedure, a multilayer printed wiring board having two or more layers, which has excellent bonding strength and acid resistance as well as a high reliability, can be obtained.

As described above, application of this invention can provide bonding between copper and a resin with excellent bonding strength and acid resistance. The method described in the present specification can be applied to bonding at ordinary temperatures and pressures without pressing and heating in the course of the bonding operation.

Practice of the method of this invention even in air at ordinary temperatures does not present any problems. In general, the surface of metallic copper is believed to form a copper oxide layer having a thickness of from a monomolecular layer to a layer composed of several molecules when in contact with air. It is presumable that, even when a thick oxide layer preliminarily formed is reduced to metallic copper according to the reduction treatment as described in the present specification, an extremely thin copper oxide film might be formed again on the surface of the copper by contact of the copper with air during a period ranging from the reduction to the lamination bonding. However, the presence of the oxide film of such a thickness does not present any particular problems of acid resistance of the treated surface layer and bonding strength. It is believed that the presence of the oxide layer having a thickness of a layer composed of several molecules might be rather preferable from the standpoint of affinity of a resin for copper.

DESCRIPTION OF THE PREFERRED EMBODIMENTS

The following Examples will illustrate the present invention with reference to instances of lamination bonding in the production of a multilayer printed wiring board.

EXAMPLE 1

Copper foils of glass-polyimide copper clad laminates and a prepreg of glass cloth impregnated with a polyimide resin were bonded together in the following four steps to effect lamination bonding of the copper clad laminates.

(1) The glass-polyimide copper clad laminates were immersed in an aqueous solution containing 50 g/l of $CuCl_2.H_2O$ and 500 g/l of HCl (36%) and having a temperature of 40° C. for one minute to effect etching of the surfaces of the copper foils of the laminates.

(2) After washing with water, the etched surfaces were treated with an aqueous solution containing 30 g/l of $NaClO_4$, 10 g/l of NaOH, and 5 g/l of $Na_3PO_4.2H_2O$ and having a temperature of 75° C. for 2 minutes to form copper oxide layers having a thickness of 1,100 Å on the surfaces.

(3) After washing with water, the copper oxide layers were treated with an aqueous solution containing 10 g/l of dimethylamine borane and having a temperature of 25° C. for 2 minutes to reduce the same.

(4) After washing with water and drying, the copper clad laminates thus treated were laminated with a prepreg of glass cloth impregnated with a polyimide resin therebetween, and mutually pressed at 170° C. under a pressure of 20 $Kgf/cm^2$ for 80 minutes to effect bonding. Thus, metallic copper formed by reduction of the oxide layer and the resin of the prepreg were bonded together.

The bonding between the copper foils and the polyimide resin of the prepreg layer lamination-bonded together was good with a peel strength of 1.2 Kgf/cm. Lamination bonding of three or more layers of laminates could also be effected.

When a copper clad laminate subjected to the reduction treatment was immersed in 1:1 hydrochloric acid prior to lamination bonding, neither discoloration nor dissolution of the treated surface layer was observed.

When the board formed by the lamination bonding was perforated to form through-holes and immersed in 1:1 hydrochloric acid, neither penetration of the acid from the walls of the through-holes nor discoloration of the bonding interface layers were observed even after immersion for over 3 hours.

EXAMPLE 2

Substantially the same procedures of the steps for lamination bonding as in Example 1 were repeated, except that glass-epoxy copper clad laminates were used instead of the glass-polyimide copper clad laminates, while a prepreg of glass cloth impregnated with an epoxy resin was used instead of the prepreg of glass cloth impregnated the polyimide resin.

The bonding between the copper foil and the epoxy resin of the prepreg layer was good with a peel strength of 2.2 Kgf/cm. The resistance to hydrochloric acid was good to such an extent that, when the resulting board was perforated to form through-holes and immersed in 1:1 hydrochloric acid for 3 hours or more, neither penetration of the acid from the walls of the throughholes nor discoloration of the bonding interface was observed.

EXAMPLE 3

Substantially the same procedures of the steps as in Example 1 were repeated, except that the reduction treatment was effected using an aqueous solution containing 5 g/l of dimethylamine borane and 5 g/l of NaOH and having a temperature of 50° C. instead of the reducing solution as mentioned in the step (3) in Example 1. In this case, the reduction reaction was completed within 30 minutes. Good results of bonding strength and acid resistance were obtained as in Example 1.

EXAMPLE 4

Substantially the same procedures of the steps for lamination bonding as in Example 1 were repeated, except that the reduction treatment was effected using an aqueous solution containing 3 g/l of ammonia borane and 4 g/l of sodium hydroxide and having a temperature of 25° C. instead of the reducing solution as mentioned in the step (3) in Example 1. The reduction of the oxide layer proceeded smoothly. The bonding strength and the acid resistance were good as in Example 1.

EXAMPLE 5

Prior to the step (1) in Example 1, copper foils on the surfaces of copper clad laminates were etched with masks of a commercially available photoresist to form circuit patterns. Subsequently, the same procedures of the steps (1) to (4) for lamination bonding as in Example 1 were repeated. The resulting board was perforated with a drill to form necessary through-holes. The inner walls of the through-holes were activated with a commercially available aqueous hydrochloric acid type palladium-tin mixed catalysts solution, and electrolessly plated to effect through-hole plating. Thus a multilayer printed wiring board was produced. After drilling of the through-holes, the board was immersed in 1:1 hydrochloric acid in the same manner as in Example 1 to carry out the acid resistance test. Even after immersion for over 3 hours, neither discoloration of the bonding interface nor penetration of the acid was observed. The bonding between the copper foil and the resin of the prepreg was good as in Example 1. Even in the step of immersion of the board in the hydrochloric acid type catalyst solution as the pretreatment for through-hole plating, neither penetration of the acid into the bonding interface from the walls of the through-holes nor discoloration of the bonding interface was observed.

EXAMPLE 6

Prior to formation of patterns by etching with masks of a photoresist as in Example 5, copper clad laminates were perforated to form through-holes, and activated with a commercially available aqueous hydrochloric acid type palladium-tin catalyst solution. The inner walls of the through-holes and the copper foils on the surfaces were electrolessly plated with a chemical copper plating solution containing 35 g/l of ethylenediaminetetraacetic acid, 6 g/l of copper sulfate, 5 ml/l of formalin (37%), 10 g/l of polyethylene glycol, and 50 mg/l of 2,2'-dipyridyl and having a pH value of 12.5 and a temperature of 75° C. to effect copper plating with a thickness of 15μm.

Thereafter, in the same manner as in Example 5, patterns were formed by etching with masks of a commercially available photoresist, followed by surface etching, formation of oxide layers, reduction treatment, and lamination bonding. Good bonding strength and acid resistance as in Example 5 were obtained with chemically plated copper.

COMPARATIVE EXAMPLE 1

Substantially the same procedures of the steps for lamination bonding except for the step (3) of reduction treatment as in Example 1 were repeated. The peel strength between the copper foil and the prepreg layer was as high as 1.2 Kgf/cm. However, immersion of the board after perforation for forming through-holes in 1:1 hydrochloric acid for about 10 minutes caused discoloration and dissolution of the bonding interface, thus presenting a problem of acid resistance. When the copper foil having an oxide layer formed in the step (2) was directly immersed in 1:1 hydrochloric acid, the oxide layer was dissolved and lost within one second.

COMPARATIVE EXAMPLE 2

Substantially the same procedures of the steps for lamination bonding except for the step of reduction treatment as in Example 2 were repeated as in Comparative Example 1. The peel strength between the copper foil and the prepreg layer was 2.2 Kgf/cm, which was the same value as in Example 2. However, the board thus prepared involved a problem of acid resistance.

COMPARATIVE EXAMPLE 3

Substantially the same procedures as in Example 1 were repeated except that immersion of the laminates in an aqueous solution containing 2 g/l of sodium borohydride and 15 g/l of sodium hydroxide and having a temperature of 50° C. for 20 minutes was conducted instead of the step (3) of reduction treatment. When the laminates thus treated, after washing with water, were immersed in 1:1 hydrochloric acid, the treated surface layers were readily dissolved with discoloration. As the time of immersion in the sodium borohydrate solution was elongated, the dark brown surface layer formed by the oxide layer formation treatment gradually faded in a mottled form.

COMPARATIVE EXAMPLE 4

Substantially the same procedures as in Example 1 were repeated except that immersion of the laminates in an aqueous solution containing 50 ml/l of formalin (37%) and 4 g/l of sodium hydroxide and having a temperature of 70° C. for 20 minutes was conducted instead of the step (3) of reduction treatment. When the laminates thus treated, after washing with water, were immersed in 1:1 hydrochloric acid, the treated surface layers were readily dissolved with discoloration. The dissolution of the treated surface layers in the acid was readier than that in Example 1.

COMPARATIVE EXAMPLE 5

The procedures of the steps for lamination bonding as in Example 1 were repeated without the step (2) of oxide layer formation treatment and the step (3) of reduction treatment. The peel strength between the copper foil and the prepreg layer was at most 0.2 Kgf/cm. Thus no sufficient bonding strength was obtained.

Although the necessary peel strength in the bonding interface between the inner layers of a multilayer printed wiring board is obscure, a peel strength of 0.5 Kgf/cm or more is usually enough.

As described hereinbefore, in the method of bonding copper and a resin together according to the present invention, bonding is effected between the surfaces of metallic copper formed by reducing a copper oxide and the resin instead of bonding between the surfaces of the copper oxide readily soluble in an acid and the resin to obtain a high bonding strength. Therefore, the problem of acid resistance before and after the bonding operation is solved to facilitate good bonding.

Incidentally, in the method of bonding copper and a resin together according to the present invention, conventional knowledges and known teachings may be adopted in connection with matters not specifically described in the present specification.

What is claimed is:

1. A method of bonding copper and a resin together comprising the steps of forming a copper oxide layer on the surface of copper by oxidiation of copper, reducing said copper oxide layer to metallic copper with a reducing solution, and bonding the surface of said metallic copper formed by said reduction and a resin together.

2. A method of bonding copper and a resin together as claimed in claim 1, wherein said reducing solution is an aqueous solution containing at least one amine borane represented by the general formula: $BH_3 \cdot NHRR'$ (wherein R and R' are each a member selected from the group consisting of H, $CH_3$, and $CH_2CH_3$)

3. A method of bonding copper and a resin together as claimed in claim 2, wherein said bonding is effected by heat-pressing said surface of said metallic copper formed by said reduction and said resin.

4. A method of bonding copper and a resin together as claimed in claim 3, wherein said resin is a member selected from the group consisting of polyimide resins, polyamide resins, epoxy resins, polyester resins, phenolic resins, polyethylene resins, polyphenylene sulfide resins, polyether-imide resins, and fluororesins.

5. A method of bonding copper and a resin together as claimed in claim 3, wherein said copper is immersed in an aqueous neutral or alkaline solution containing an oxidizing agent to form said copper oxide layer on the surface of copper.

6. A method of bonding copper and a resin together as claimed in claim 5, wherein said oxidizing agent is a chlorite or a persulfate.

7. A method of bonding copper and a resin together comprising the step (i) of forming copper oxide layers on the surfaces of copper foils of a plurarity of copper clad laminates, the step (ii) of reducing said copper oxide layers to metallic copper with a reducing solution, and the step (iii) of heat-pressing an assembly of said copper clad laminates subjected to the step (ii) which are piled up with a prepreg(s) therebetween impregnated with a resin for contact of the surfaces of said metallic copper with said resin of said prepreg(s) to effect bonding of said metallic copper and said resin of said prepreg(s).

8. A method of bonding copper and a resin together as claimed in claim 7, wherein said copper foils have predetermined patterns formed.

9. A method of bonding copper and a resin together as claimed in claim 8, wherein said reducing solution is an aqueous solution containing at least one amine borane represented by the general formula: $BH_3 \cdot NHRR'$ (wherein R and R' are each a member selected from the group consisting of H, $CH_3$, and $CH_2CH_3$)

10. A method of bonding copper and a resin together as claimed in claim 9, wherein said resin is a member selected from the group consisting of polyimide resins, polyamide resins, epoxy resins, polyester resins, phenolic resins, polyethylene resins, polyphenylene sulfide resins, polyetherimide resins, and fluororesins.

11. A method of bonding copper and a resin together as claimed in claim 9, wherein said surface of copper foils are immersed in an aqueous neutral or alkaline solution containing an oxidizing agent to form said copper oxide layers on said surfaces of copper foils.

* * * * *